(12) United States Patent
Teng

(10) Patent No.: US 12,231,146 B2
(45) Date of Patent: Feb. 18, 2025

(54) METHOD AND NON-TRANSITORY COMPUTER-READABLE STORAGE MEDIUM AND APPARATUS FOR DECODING LOW-DENSITY PARITY-CHECK (LDPC) CODE

(71) Applicant: Silicon Motion, Inc., Zhubei (TW)

(72) Inventor: Duen-Yih Teng, Taoyuan (TW)

(73) Assignee: Silicon Motion, Inc., Zhubei (TW)

( * ) Notice: Subject to any disclaimer, the term of this patent is extended or adjusted under 35 U.S.C. 154(b) by 1 day.

(21) Appl. No.: 18/220,464

(22) Filed: Jul. 11, 2023

(65) Prior Publication Data
US 2024/0030939 A1    Jan. 25, 2024

(30) Foreign Application Priority Data
Jul. 20, 2022   (CN) .......................... 202210863780.7

(51) Int. Cl.
*H03M 13/11*     (2006.01)
(52) U.S. Cl.
CPC .... *H03M 13/1108* (2013.01); *H03M 13/1174* (2013.01)
(58) Field of Classification Search
CPC ......... H03M 13/1108; H03M 13/1174; H03M 13/1131; G06F 11/1068; G11C 29/42
See application file for complete search history.

(56) References Cited

U.S. PATENT DOCUMENTS

| | | | |
|---|---|---|---|
| 8,255,758 B2 * | 8/2012 | Anholt | G06F 11/1008 714/752 |
| 11,005,499 B2 | 5/2021 | Kim et al. | |
| 11,349,498 B2 * | 5/2022 | Kaynak | H03M 13/1177 |
| 2018/0375530 A1 * | 12/2018 | Palangappa | G06F 11/1032 |

(Continued)

FOREIGN PATENT DOCUMENTS

| | | |
|---|---|---|
| CN | 113032178 A | 6/2021 |
| TW | I646783 B | 1/2019 |

(Continued)

*Primary Examiner* — Albert Decady
*Assistant Examiner* — Grace V Braden
(74) *Attorney, Agent, or Firm* — Birch, Stewart, Kolasch & Birch, LLP

(57) ABSTRACT

The invention relates to a method, a non-transitory computer-readable storage medium and an apparatus for decoding a Low-Density Parity-Check (LDPC) code. The method, which is performed by a processing unit in an LDPC decoder, includes the following steps: determining whether a bit flipping algorithm when decoding a codeword enters a trapping state after an observation period during which a sequential selection strategy is used; and modifying a scheduling strategy to a non-sequential selection strategy and performing the bit flipping algorithm on the codeword under the non-sequential selection strategy when the bit flipping algorithm enters the trapping state. The codeword is divided into chunks in fixed-length and the sequential selection strategy indicates sequentially selecting the chunks in the codeword, so that the bit flipping algorithm is performed on one selected chunk only each time. The non-sequential (Continued)

selection strategy indicates an arbitrary selection combination of the chunks in the codeword, which is different from that under the sequential selection strategy.

20 Claims, 8 Drawing Sheets

(56) References Cited

U.S. PATENT DOCUMENTS

| | | | |
|---|---|---|---|
| 2019/0068219 A1* | 2/2019 | Bhatia | H03M 13/1108 |
| 2019/0312593 A1 | 10/2019 | Hsiao et al. | |
| 2019/0377514 A1 | 12/2019 | Ko | |
| 2020/0341679 A1 | 10/2020 | Hsiao | |
| 2021/0175900 A1 | 6/2021 | Kuo | |

FOREIGN PATENT DOCUMENTS

| | | |
|---|---|---|
| TW | I664528 B | 7/2019 |
| TW | I686804 B | 3/2020 |

* cited by examiner

METHOD AND NON-TRANSITORY COMPUTER-READABLE STORAGE MEDIUM AND APPARATUS FOR DECODING LOW-DENSITY PARITY-CHECK (LDPC) CODE

CROSS-REFERENCE TO RELATED APPLICATIONS

This application claims the benefit of priority to Patent Application No. 202210863780,7, filed in China on Jul. 20, 2022; the entirety of which is incorporated herein by reference for all purposes.

BACKGROUND

The disclosure generally relates to storage devices and, more particularly, to a method, a non-transitory computer-readable storage medium and an apparatus for decoding Low-Density Parity-Check (LDPC) code.

Flash memory devices typically include NOR flash devices and NAND flash devices. NOR flash devices are random access—a central processing unit (CPU) accessing a NOR flash device can provide the device any address on its address pins and immediately retrieve data stored in that address on the device's data pins. NAND flash devices, on the other hand, are not random access but serial access. It is not possible for NAND to access any random address in the way described above. Instead, the CPU has to write into the device a sequence of bytes which identifies both the type of command requested (e.g. read, write, erase, etc.) and the address to be used for that command. The address identifies a page (the smallest chunk of flash memory that can be written in a single operation) or a block (the smallest chunk of flash memory that can be erased in a single operation), and not a single byte or word. Improving the efficiency of reading data from a flash module has always been an important issue affecting the overall performance of the flash controller. Thus, it is desirable to have a method, a non-transitory computer-readable storage medium and an apparatus for decoding LDPC code to improve the efficiency of reading data from a flash module.

SUMMARY

The disclosure relates to a method for decoding a Low-Density Parity-Check (LDPC) code, which is performed by a processing unit in an LDPC decoder, to include the following steps: determining whether a bit flipping algorithm when decoding a codeword enters a trapping state after an observation period during which a sequential selection strategy is used; and modifying a scheduling strategy to a non-sequential selection strategy and performing the bit flipping algorithm on the codeword under the non-sequential selection strategy when the bit flipping algorithm enters the trapping state.

The disclosure relates to a non-transitory computer-readable storage medium having stored therein program code that, when loaded and executed by a processing unit in an LDPC decoder, causes the processing unit to perform the method for decoding an LDPC code.

The disclosure relates to an apparatus for decoding an LDPC code to include: a variable-node calculation circuitry; and a processing unit. The variable-node calculation circuitry is arranged operably to: determine whether a bit flipping algorithm when decoding a codeword enters a trapping state after an observation period during which a sequential selection strategy is used; and modify a scheduling strategy to a non-sequential selection strategy and drive the variable-node calculation circuitry to perform the bit flipping algorithm on the codeword under the non-sequential selection strategy when the bit flipping algorithm enters the trapping state.

The codeword is divided into chunks in fixed-length and the sequential selection strategy indicates sequentially selecting the chunks in the codeword, so that the bit flipping algorithm is performed on one selected chunk only each time. The non-sequential selection strategy indicates an arbitrary selection combination of the chunks in the codeword, which is different from that under the sequential selection strategy.

Both the foregoing general description and the following detailed description are examples and explanatory only, and are not restrictive of the invention as claimed.

DETAILED DESCRIPTION

Reference is made in detail to embodiments of the invention, which are illustrated in the accompanying drawings. The same reference numbers may be used throughout the drawings to refer to the same or like parts, components, or operations.

The present invention will be described with respect to particular embodiments and with reference to certain drawings, but the invention is not limited thereto and is only limited by the claims. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent." etc.)

Figure 1:
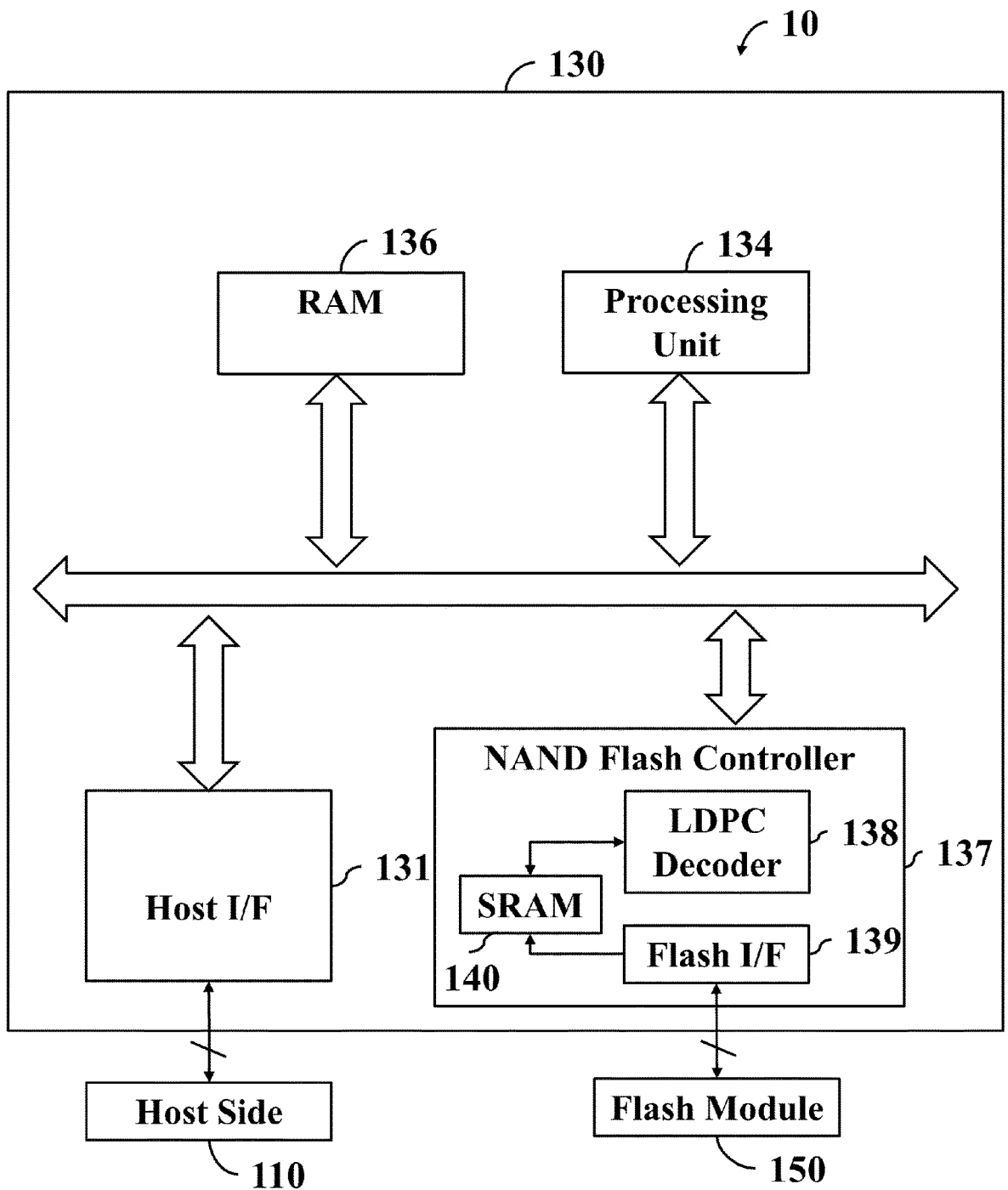
FIG. 1 is the system architecture of an electronic apparatus according to an embodiment of the invention.

Refer to FIG. 1. The electronic apparatus 10 includes the host side 110, the flash controller 130 and the flash module 150, and the flash controller 130 and the flash module 150 may be collectively referred to as a device side. The electronic apparatus 10 may be practiced in a Personal Computer (PC), a laptop PC, a tablet PC, a mobile phone, a digital camera, a digital recorder, smart television, smart refrigerator, or other consumer electronic products. The host side 110 and the host interface (I/F) 131 of the flash controller 130 may communicate with each other by Universal Serial Bus (USB), Advanced Technology Attachment (ATA), Serial Advanced Technology Attachment (SATA), Peripheral Component Interconnect Express (PCI-E), Universal Flash Storage (UFS), Embedded Multi-Media Card (eMMC) protocol, or others. The NAND flash controller (NFC) 137 of the flash I/F 139 and the flash module 150 may communicate with each other by a Double Data Rate (DDR) protocol, such as Open NAND Flash Interface (ONFI), DDR Toggle, or others. The flash controller 130 includes the processing unit 134 and the processing unit 134 may be implemented in numerous ways, such as with general-purpose hardware (e.g., a microcontroller unit, a single processor, multiple processors or graphics processing units capable of parallel computations, or others) that is programmed using firmware and/or software instructions to perform the functions recited herein. The processing unit 134 receives host commands, such as host read, write, discard, trim, erase commands, through the host I/F 131, schedules and executes these commands. The flash controller 130 includes the Random Access Memory (RAM) 136 and the RAM 136 may be implemented in a Dynamic Random Access Memory (DRAM), a Static Random Access Memory (SRAM), or the combination thereof, for allocating space as a data buffer storing user data (also referred to as host data) that is to be programmed into the flash module 150, and has been read from the flash module 150 and is to be output to the host side 110. The RAM 136 stores necessary data in execution, such as variables, data tables, data abstracts, host-to-flash (H2F) tables, flash-to-host (F2H) tables, and so on. The NFC 137 provides functions that are required to access to the flash module 150, such as a command sequencer, a Low-Density Parity-Check (LDPC) encoder/decoder, etc.

A bus architecture may be configured in the flash controller 130 for coupling between components to transfer data, addresses, control signals, etc., which include the host I/F 131, the processing unit 134, the RAM 136, the NFC 137, and so on. The bus includes a set of parallel physical-wires connected to two or more components of the flash controller 130. The bus is a shared transmission medium so that only two devices can access to the wires to communicate with each other for transmitting data at any one time. Data and control signals travel in both directions between the components along data and control lines, respectively. Addresses on the other hand travel only one way along address lines. For example, when the processing unit 134 wishes to read data from a particular address of the RAM 136, the processing unit 134 sends this address to the RAM 136 on the address lines. The data of that address is then returned to the processing unit 134 on the data lines. To complete the data read operation, control signals are sent along the control lines.

The flash module 150 provides huge storage space typically in hundred Gigabytes (GB), or even several Terabytes (TB), for storing a wide range of user data, such as high-resolution images, video files, etc. The flash module 150 includes control circuits and memory arrays containing memory cells that can he configured as Single Level Cells (SLCs), Multi-Level Cells (MLCs), Triple Level Cells (TLCs), Quad-Level Cells (QLCs), or any combinations thereof. The processing unit 134 programs user data into a designated address (a destination address) of the flash module 150 and reads user data from a designated address (a source address) thereof through the flash I/F 139. The flash I/F 139 may use several electronic signals run on physical wires including data lines, a clock signal line and control signal lines for coordinating the command, address and data transfer with the flash module 150. The data lines may be used to transfer commands, addresses, read data and data to be programmed; and the control signal lines may be used to transfer control signals, such as Chip Enable (CE), Address Latch Enable (ALE), Command Latch Enable (CLE), Write Enable (WE), etc.

Figure 2:
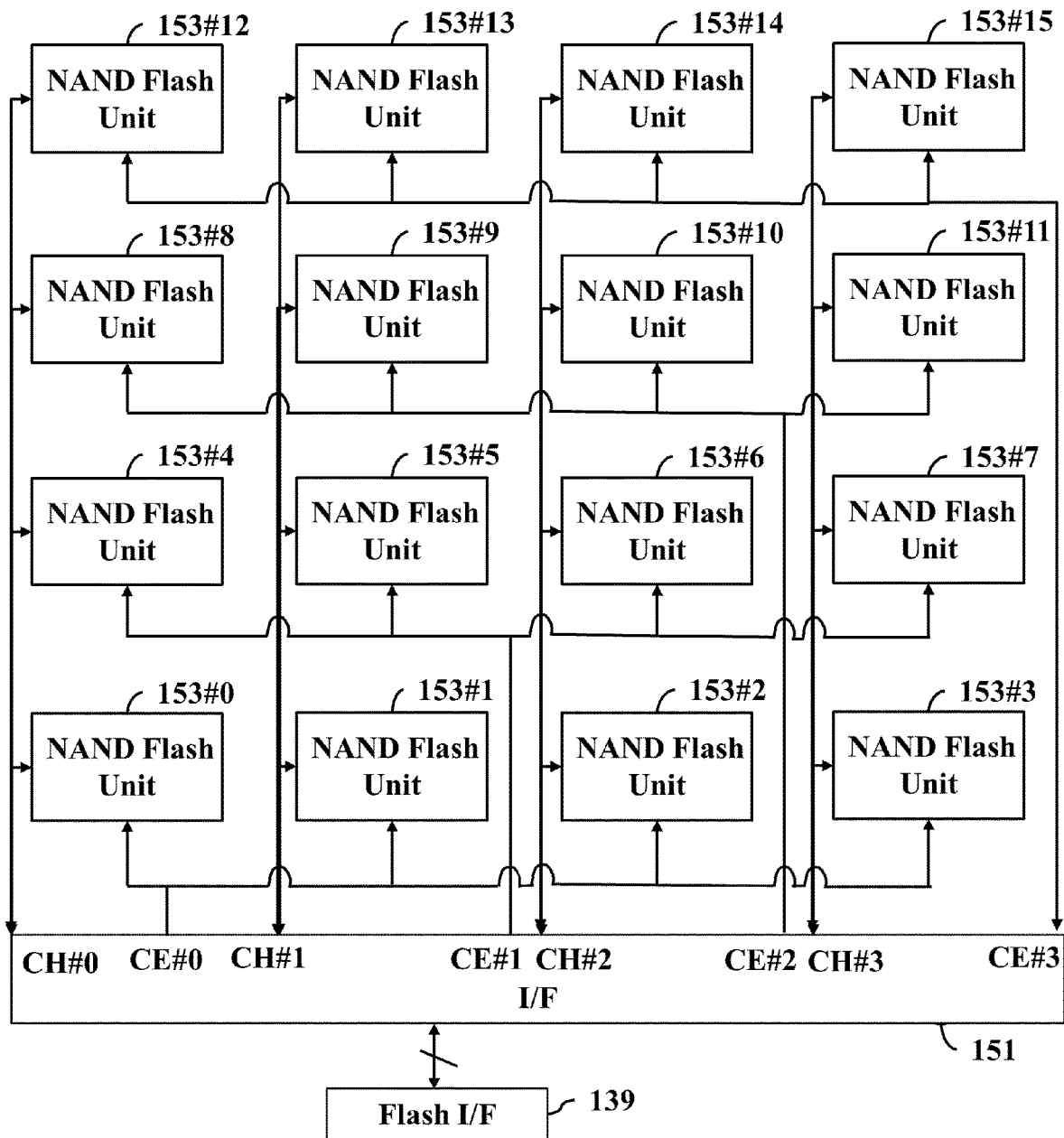
FIG. 2 is a schematic diagram illustrating a flash module according to an embodiment of the invention.

Refer to FIG. 2. The flash I/F 151 may include four I/O channels (hereinafter referred to as channels) CH#0 to CH#3 and each is connected to four NAND flash units, for example, the channel CH#0 is connected to the NAND flash units 153#0, 153 #4, 153#8, and 153#12. Each NAND flash unit can be packaged in an independent die. The flash I/F 139 may issue one of the CE signals CE#0 to CE#3 through the I/F 151 to activate the NAND flash units 153#0 to 153#3, the NAND flash units 153 #4 to 153#7, the NAND flash units 153#8 to 153#11, or the NAND flash units 153#12 to 153#15, and read data from or program data into the activated NAND flash units in parallel. Those artisans may modify the design of the flash modules 150 to include more or less channels, and/or make each channel connect more or less NAND flash units according to different system requirements, and the invention should not be limited thereto.

The NFC 137 may include an LDPC encoder capable of generating an LDPC code according to user data, which is a linear error correcting code. For example, the generation of LDPC code can be expressed with the following formula:

$$MSG_{1 \times n} \odot PCM_{n \times (n+m)} = CW_{1 \times (n+m)}$$

where $MSG_{1 \times n}$ represents a 1-row, n-column matrix of user data, $PCM_{n \times (n+m)}$ represents a n-row, (n+m)-column of parity check matrix, $CW_{1 \times (n+m)}$ represents a 1-row, (n+m)-column matrix of final codeword, and $\odot$ represents the modulo 2 multiplication. The parity check matrix may include a Quasi-Cyclic (QC) structure. The value of the first n bits in $CW_{1 \times (n+m)}$ is equal to the value of $MSG_{1 \times n}$ and the value of the last m bits in $CW_{1 \times (n+m)}$ is referred to as LDPC code. An example is as follows:

$$(101) \odot \begin{pmatrix} 1 & 0 & 0 & 1 & 0 & 1 \\ 0 & 1 & 0 & 1 & 1 & 1 \\ 0 & 0 & 1 & 1 & 1 & 0 \end{pmatrix} = (101011)$$

Those artisans know that a well-known efficient algorithm (such as 2-stage encoding, etc.) with a corresponding parity check matrix can be used to generate the LDPC code.

Figure 3:
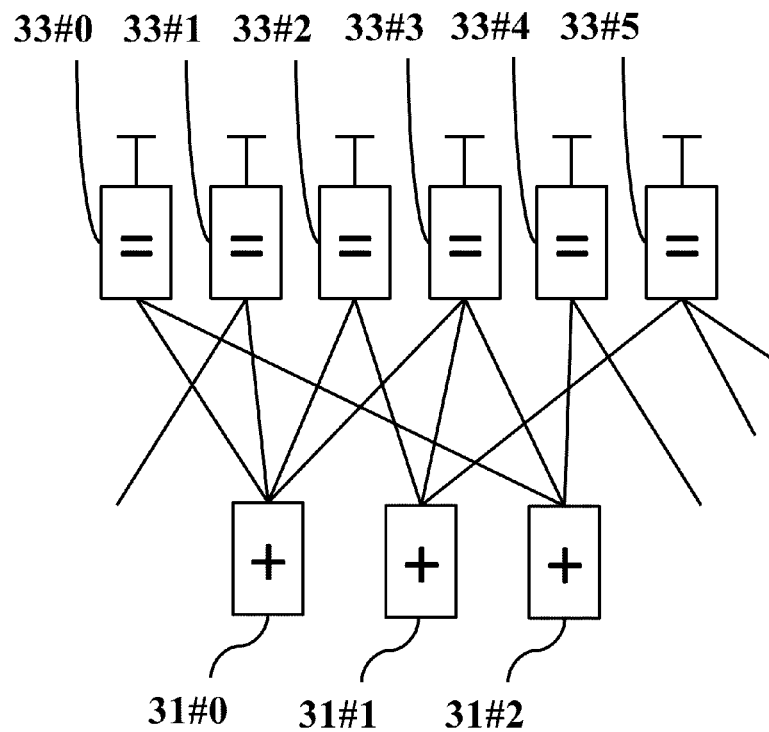
FIG. 3 is a schematic diagram illustrating an exemplary Low-Density Parity-Check (LDPC) code according to an embodiment of the invention.

The NFC 137 includes the LDPC decoder 138 capable of reading codewords (each including user data and an LDPC code) from the flash module 150 through the flash I/F 139 and determining whether each codeword includes any error bit. Once discovering any error bit in any codeword, the LDPC decoder 138 attempts to recover a correct codeword and obtain the user data from the correct one. If the correct codeword cannot be recovered after a predetermined number of attempts, the LDPC decoder 138 determines that the codeword is an uncorrectable codeword. For LDPC decoding, refer to FIG. 3 showing an exemplary (n=3, k=6) LDPC code. Blocks 33#0 to 33#5 represent variable nodes and blocks 31#0 to 31#2 represent check nodes. Bit values of the variable nodes 33#0 to 33#5 form a codeword composed of user data and an LDPC code, and the bit values of the codeword satisfy the graphical constraints. Specifically, all lines connecting to a variable node have the same value, and all values connecting to a check node must sum, modulo two, to zero (that is, they must sum to an even number, or there must be an even number of odd values). The check nodes 31#0 to 31#2 may also be called syndromes.

The NFC 137 includes the static random access memory (SRAM) 140 for storing necessary data in decoding. The flash I/F 139 may store codewords (including hard bits) and soft bits read from the flash module 150 in designated addresses in the SRAM 140. Each hard bit corresponds to at least one soft bit to indicate the likelihood of belief for this hard bit. To correct error bits in each hard bit, the SRAM 140 needs to allocate space to store updated variable nodes and the corresponding soft bits during the decoding. Similarly, each variable node corresponds to at least one soft bit to indicate the likelihood of belief for this variable node. However, the SRAM 140 is a scarce resource that requires proper planning and use to improve its utilization.

Figure 4:
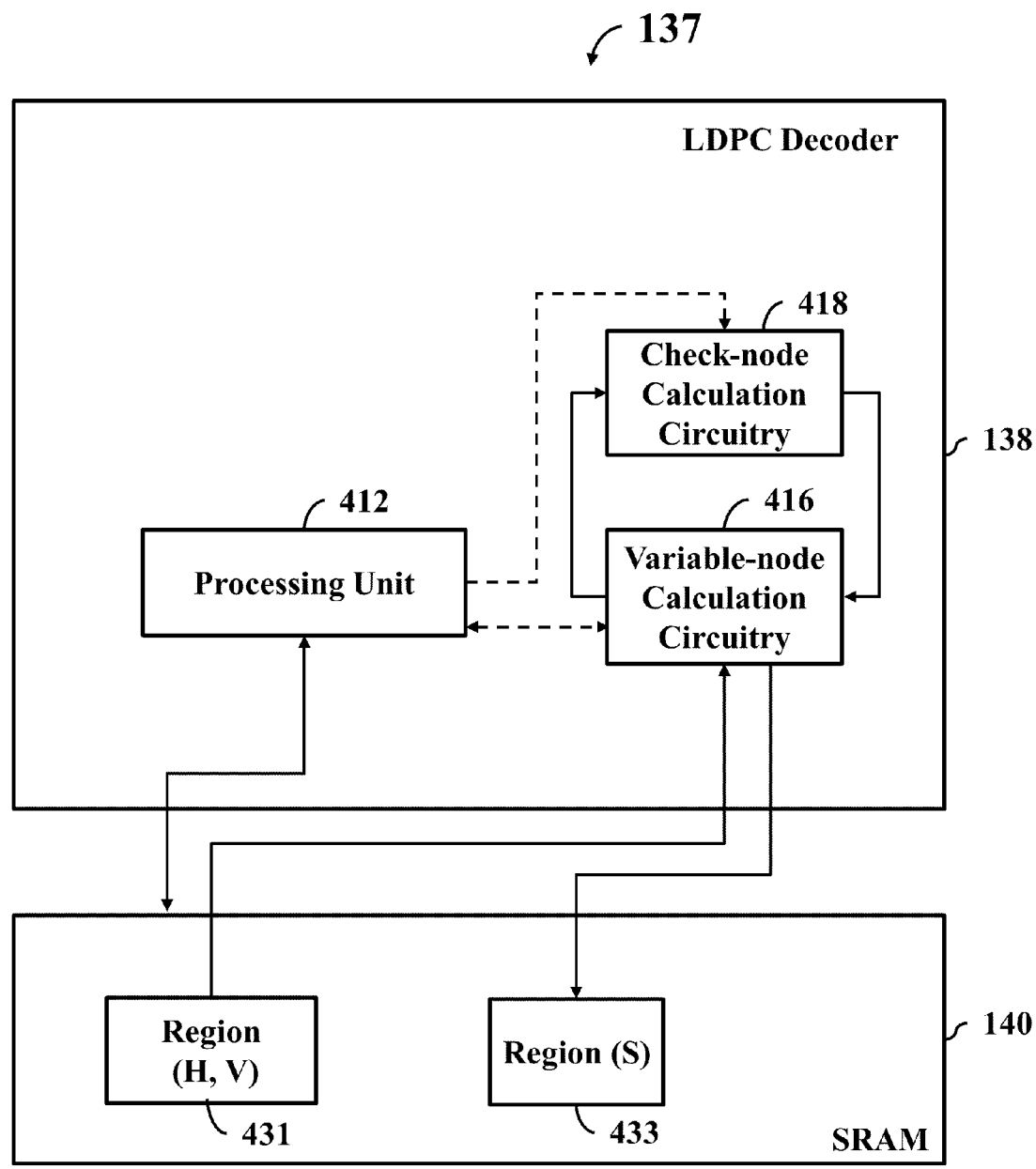
FIG. 4 is a block diagram showing a NAND flash controller (NEC) according to an embodiment of the invention.

Refer to FIG. 4 illustrating a block diagram of the NFC 137. Specifically, the LDPC decoder 138 includes two important circuitries: the check-node calculation circuitry 418 and the variable-node calculation circuitry 416. The check-node calculation circuitry 418 performs the modulo 2 multiplication on each hard bit or variable node with the parity check matrix to calculate syndromes. The variable-node calculation circuitry 416 executes a well-known bit flipping algorithm to generate new variable nodes according to the soft bits corresponding to each codeword or variable node and uses a well-known formula to calculate soft bits of the new variable nodes. The region 431 is allocated in the SRAM 140 for storing hard bits and variable nodes and the region 433 is allocated in the SRAM 140 for storing soft bits corresponding to the hard bits and variable nodes. The flash I/F 139 writes the codeword (including hard bits) read from the flash module 150 into the region 431. In some embodiments, the flash I/F 139 may include soft-bit calculation circuitry for calculating a soft bit for each hard bit in the codeword and writing the calculated soft bits into the region 433. The variable-node calculation circuitry 416 writes the variable nodes and their soft bits into the regions 431 and 433, respectively. The LDPC decoder 138 includes the processing unit 412 that can be implemented in numerous ways, such as with general-purpose hardware (e.g., a microcontroller unit; a single processor, multiple processors or graphics processing units capable of parallel computations, or others) that is programmed using firmware and/or software instructions to perform the functions recited herein. For example, the processing unit 412 coordinates the operations performed by the check-node calculation circuitry 418 and the variable-node calculation circuitry 416 during the decoding. Those artisans may arrange the processing unit 412 outside of the LDPC decoder 138 and the invention should not be limited thereto.

The check-node calculation circuitry 418 calculates the syndromes according to the hard bits or the variable nodes stored in the region 431, and the parity check matrix. The generation of syndromes can be expressed with the following formula:

$$PCM_{n \times (n+m)} \odot CW_{(n+m) \times 1} = SYD_{m \times 1}$$

where $PCM_{n \times (n+m)}$ represents a n-row, (n+m)-column of parity check matrix, $CW_{(n+m) \times 1}$ represents a (n+m)-row, 1-column matrix of codeword, $SYD_{m \times 1}$ represents a m-row, 1-column of syndromes, and $\odot$ represents the modulo 2 multiplication. An example is as follows:

$$\begin{pmatrix} 1 & 1 & 1 & 1 & 0 & 0 \\ 0 & 0 & 1 & 1 & 0 & 1 \\ 1 & 0 & 0 & 1 & 1 & 0 \end{pmatrix} \odot \begin{pmatrix} 1 \\ 0 \\ 1 \\ 0 \\ 1 \\ 1 \end{pmatrix} = \begin{pmatrix} 0 \\ 0 \\ 0 \end{pmatrix}$$

Since the calculated syndromes are all "0", the codeword does not contain error bits. If the calculated syndromes are not all "0", the codeword contains error bits. The check-node calculation circuitry 418 outputs the hard bits or the variable nodes, and the calculated syndromes to the variable-node calculation circuitry 416. In some embodiments, the check-node calculation circuitry 418 may calculate the reliabilities of syndromes according to the soft bits corresponding to the hard bits or the variable nodes and transmit the syndromes together with their reliabilities to the variable-node calculation circuitry 416.

The variable-node calculation circuitry 416 determines whether the codeword received from the check-node calculation circuitry 418 needs to be corrected. If not needed (that is, the syndromes are all "0"), the variable-node calculation circuitry 416 sends a successful decoding message to the processing unit 412. If needed (that is, the syndromes are not all "0"), the variable-node calculation circuitry 416 sends a message of decoding failure to the processing unit 412 and performs a well-known bit flipping algorithm to change the state(s) of one or more hard bits in the codeword, or variable nodes that could be wrong (that is, change "0b0" to "0b1", or change "0b1" to "0b0" for any suspicious bit) according to the syndromes, hard bits or variable nodes, and soft bits corresponding to the hard bits or the variable nodes. The variable nodes may also be referred to as a codeword collectively. The variable-node calculation circuitry 416 stores the updated variable nodes in the region 431 in the SRAM 140. Subsequently, the variable-node calculation circuitry 416 uses one or more well-known formulae to calculate soft bits corresponding to the updated variable nodes accordingly and stores the calculated soft bits in the region 433 in the SRAM 140. The soft bits may be Log-Likelihood Ratio (LLR), Quantization of LLR, or others.

Figure 5:
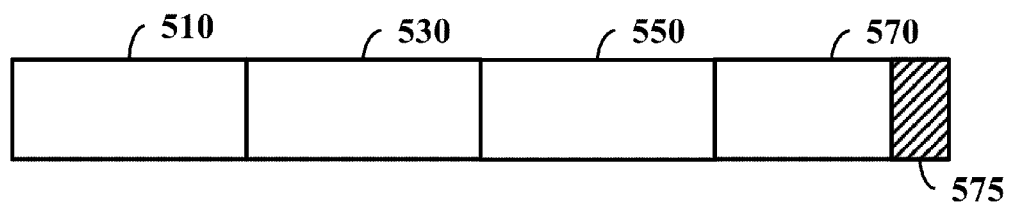
FIG. 5 is a schematic diagram showing exemplary chunk divisions of a codeword according to an embodiment of the invention.

A segment of codeword (including the hard bits read from the flash module 150 or the variable nodes generated by the variable-node calculation circuitry 416) may be divided into fixed-length (such as 16-, 32-, 64-, 128-, 256-, 512-, 736-bit, etc.) chunks depending on the computation capability of the variable-node calculation circuitry 416. The codeword includes user data and an LDPC code and a common code rate is 0.9 approximately. That is, the user data accounts for nearly 90% of the entire codeword. Refer to FIG. 5. For example, the codeword 50 may be divided into fixed-length chunks 510, 530, 550 and 570 and the chunk 570 includes the LDPC code 575. Although the embodiments describe four chunks as follows, those artisans may divide a segment of codeword into arbitrary number of chunks, which is greater than one, depending on the system requirements. In previous implementations, the variable-node calculation circuitry 416 repeatedly performs the operations of multiple iterations, and sequentially performs the bit flipping for one chunk in the codeword in each iteration, where the number of iterations cannot exceed the preset threshold. For example, the bit flipping is performed on the chunks 510, 530, 550 and 570 in sequence. However, since the parity check matrix may contain a trapping set causing the bit flipping algorithm enters the trapping state, so that after performing the maximum number of iterations, syndromes of all "0" cannot be found by the check-node calculation circuitry 418.

In order to avoid entering the trapping state, an embodiment of the invention implements a novel scheduling strategy in the method for decoding LDPC codes, which is different from the sequential selection of different chunks in the codeword as described above. The LDPC decoding method, performed by the processing unit 412 in the LDPC decoder 138, includes: determining whether a bit flipping algorithm when decoding a codeword enters a trapping state after an observation period during which a sequential selection strategy is used; and changing a scheduling strategy to a non-sequential selection strategy, and performing the bit flipping algorithm on the codeword under the non-sequential selection strategy when the bit flipping algorithm enters the trapping state. The sequential selection strategy indicates sequentially selecting a plurality of chunks in the codeword, so that the bit flipping algorithm is performed on the selected chunk only each time. The non-sequential selection strategy indicates an arbitrary selection combination of the chunks in the codeword, which is different from that under the sequential selection strategy.

Figure 6:
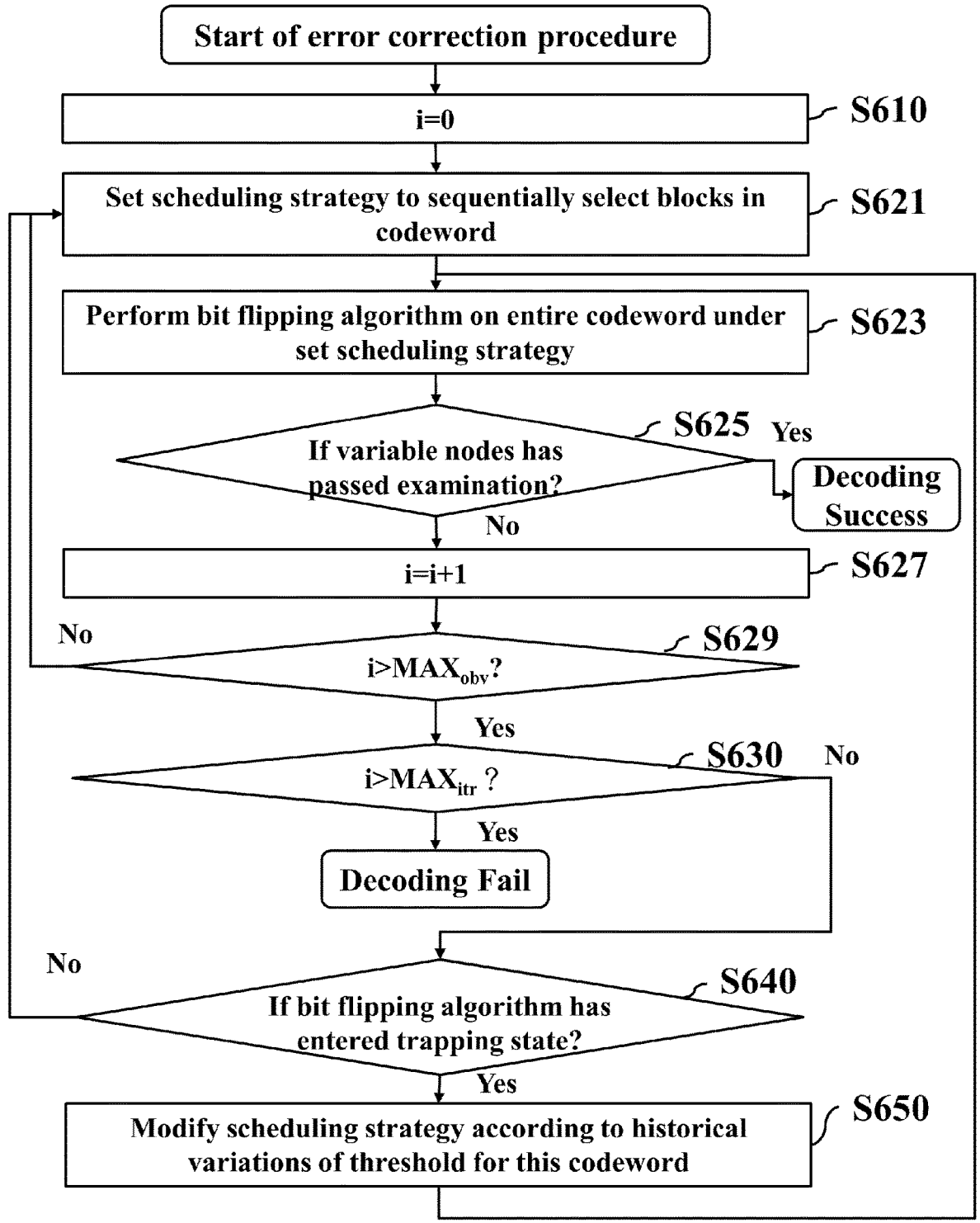
FIG. 6 is a flowchart illustrating a method for correcting error bits according to an embodiment of the invention.

Specifically, the check-node calculation circuitry 418 instructs the processing unit 412 to start executing an error correction procedure when discovering that the codeword read from the flash module 150 fails to pass the examination. With reference to FIG. 6 illustrating a flowchart of an error correction method, the details are as follows:

Step S610: The variable i is initialized to 0. The processing unit 412 uses the variable i to record the rounds of iterations, so as to control the execution times of iterations not to exceed the preset maximum allowable number of times, $MAX_{itr}$.

Step S621: The scheduling strategy is set to sequentially select a plurality of chunks in the codeword, so-called as the sequential selection strategy, so that the bit flipping algorithm is performed on the selected chunk each time. For example, refer to FIG. 4, the scheduling strategy is set to sequentially select the chunks 510, 530, 550 and 570.

Figure 7:
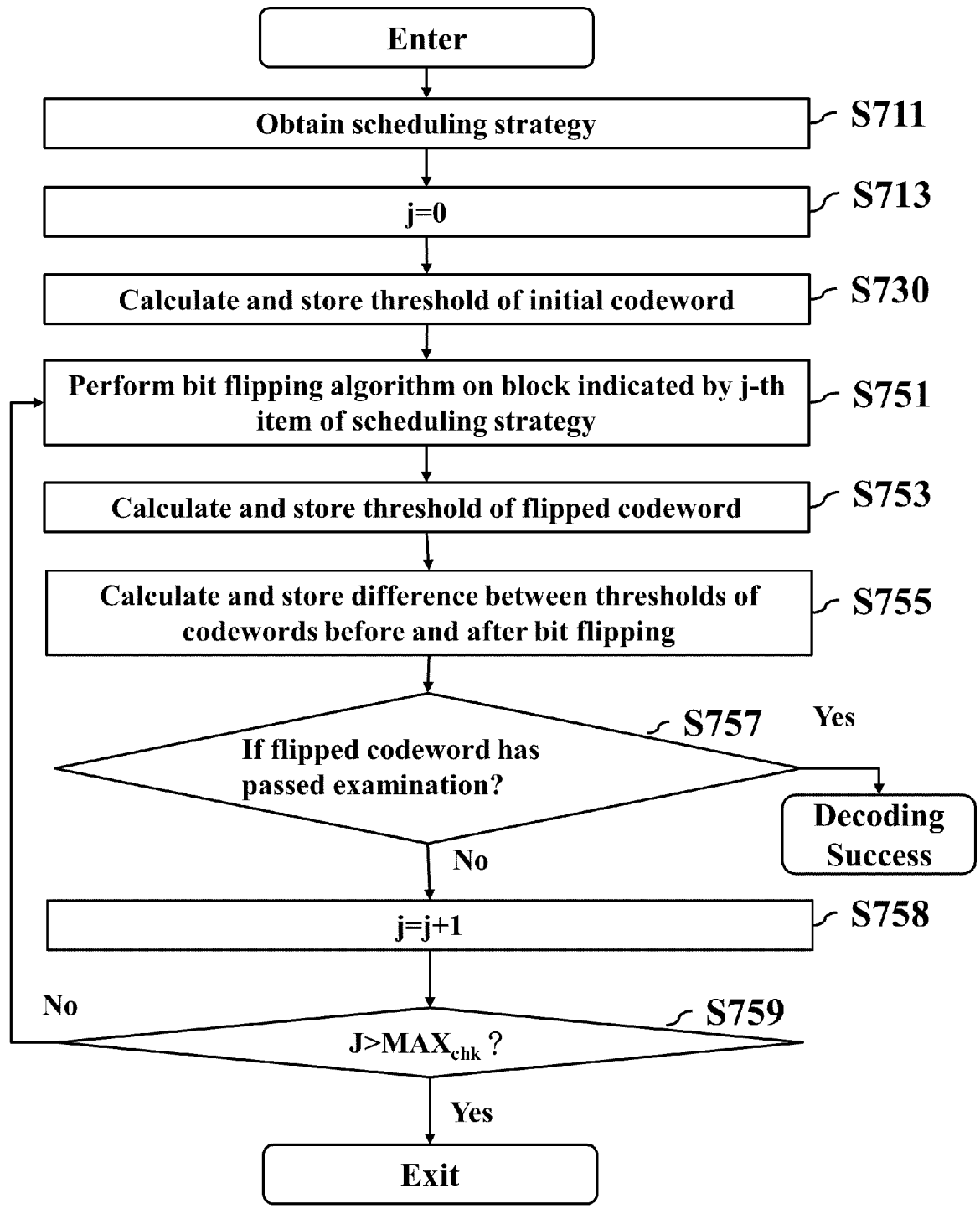
FIG. 7 is a flowchart illustrating a bit flipping procedure according to an embodiment of the invention.

Step S623: The bit flipping algorithm is performed on the entire codeword under the set scheduling strategy (may be the sequential or non-sequential selection strategy). This step may represent an iteration of bit flipping for the entire codeword. For details, refer to the description of the flowchart illustrating the method as shown in FIG. 7 in the following paragraphs. The processing unit 412 may drive the variable-node calculation circuitry 416 to perform the bit flipping on the designated chunk in the codeword. The variable-node calculation circuitry 416 sends a decoding success message to the processing unit 412 when the flipped codeword has passed the examination by the variable-node calculation circuitry. The processing unit 412 knows that the bit flipping of this iteration fails when the variable-node calculation circuitry 416 performs the bit flipping on all required chunks in the codeword but fails to decode successfully.

Regarding the technical details of step S623, with reference to FIG. 7 illustrating a flowchart of a bit flipping procedure, the details are as follows:

Step S711: The scheduling strategy (may be the sequential or non-sequential selection strategy) is obtained. In an example, refer to FIG. 5, the sequential selection strategy may be expressed as {#510, #530, #550, #570}, which means that the chunks 510, 530, 550 and 570 are sequentially selected for bit flipping. In another example, the non-sequential selection strategy may be {#530, #550, #570}, which means that the chunk 510 is skipped and the chunks 530, 550 and 570 are sequentially selected for bit flipping. In still another example, the non-sequential selection strategy may be {#570, #550, #530, #510}, which means that the chunks 570, 550, 530 and 510 are sequentially selected for bit flipping.

Step S713: The variable j is initialized to 0. The processing unit 412 uses the variable j to record the number of chunks, which have been flipped, so as to control the execution times of bit flipping not to exceed the total number of chunks that need to be processed, $MAX_{chk}$. It is to be noted that, due to the variation of scheduling strategy, $MAX_{chk}$ set in different iterations may be different.

Step S730: The threshold of an initial codeword (may be referred to as a before-bit-flipping codeword) is calculated and stored, which indicates the erroneous extent of the initial codeword. The closer to "0", the lower erroneous degree, and the more it is higher than "0", the higher the erroneous degree. Firstly, the processing unit 412 uses predefined well-known check equations to calculation syndrome weights for each bit in the codeword, for example, uses four check equations to calculate four syndrome weights. Each check equation calculates one syndrome weight to represent the erroneous extent of a designated bit according to the soft bit of the designated bit, a specific syndrome associated with the designated bit, and other bits associated with the specific syndrome. The closer to "0" the lower erroneous degree, and the more it is higher than "0", the higher the erroneous degree. The bit as described above can refer to a hard bit or a variable node. The processing unit 412 may user Tanner graph to derive the specific syndrome associated with the designated bit, and other bits associated with the specific syndrome. Next, all calculated syndrome weights for each bit are summed up to generate a syndrome-weight summation representing the overall erroneous extent of this bit. The processing unit 412 finally obtains the maximum value from the syndrome-weight summations of all bits as the threshold of the initial codeword, and stores the threshold of the initial codeword in a designated address of the SRAM 140.

Step S751: The bit flipping algorithm is performed on the chunk indicated by the j-th item of the scheduling strategy to generate a flipped codeword (may be referred to as an after-bit-flipping codeword). Assume that the scheduling strategy is set to {#510, #530, #550, #570} and j is counted to 2: The processing unit 412 may output an address signal of the chunk 550 to the variable-node calculation circuitry 416, which is used to drive the variable-node calculation circuitry 416 to read the hard bits or the variable nodes of the chunk 550 from the region 431 and perform the well-known bit flipping algorithm for changing the state of one or more hard bits or variable nodes that may be faulty in the chunk 550 according to the syndromes, the hard bits or the variable nodes, and the soft bits corresponding to the hard bits or the variable nodes.

Step S753: The threshold of the flipped codeword for indicating the erroneous extent of the flipped codeword is calculated and stored. The closer to "0", the lower erroneous degree, and the more it is higher than "0", the higher the erroneous degree. The details of the calculation can be derived from step S751 and will not be repeated for brevity.

Step S755: The difference between the thresholds of the codewords before and after the bit flipping, which indicates the erroneous improvement of the flipped codeword, is calculated and stored in a designated address of the SRAM 140. A difference of "0" means no improvement, a positive difference means to become worse, and a negative difference means to become better. The processing unit 412 may use a data table in a designated address of the SRAM 140 to store historical variations of the thresholds for this codeword. Assume that each of the scheduling strategies of the first three iterations is {#510, #530, #550, #570}: Table 1 shows an exemplary data table as follows:

TABLE 1

| Iteration No. | First flipping | | | Second flipping | | Third flipping | | Fourth flipping | |
|---|---|---|---|---|---|---|---|---|---|
| | Tr0 | Tr1 | Dif1 | Tr2 | Dif2 | Tr3 | Dif3 | Tr4 | Dif4 |
| 1 | 2 | 3 | +1 | 2 | −1 | 2 | 0 | 2 | 0 |
| 2 | 2 | 3 | +1 | 2 | −1 | 2 | 0 | 2 | 0 |
| 3 | 2 | 3 | +1 | 2 | −1 | 2 | 0 | 2 | 0 |

The column Tr0 stores the threshold of the initial codeword, the column Tr1 stores the threshold of the codeword after the chunk 510 therein is flipped and the column Dif1 stores the result of subtracting Tr0 from Tr1. The column Tr2 stores the threshold of the codeword after the chunk 520 therein is flipped and the column Dif2 stores the result of subtracting Tr1 from Tr2. The column Tr3 stores the threshold of the codeword after the chunk 530 therein is flipped and the column Dif3 stores the result of subtracting Tr2 from Tr3. The column Tr4 stores the threshold of the codeword after the chunk 540 therein is flipped and the column Dif4 stores the result of subtracting Tr3 from Tr4.

Step S757: It is determined whether the flipped codeword has passed the examination. The variable-node calculation circuitry 416 transmits the flipped codeword to the check-node calculation circuitry 418, determines whether the flipped codeword has passed the examination according to the syndromes received from the check-node calculation circuitry 418 and transmits a decoding success or fail message to the processing unit 412 according to the determination result. If the processing unit 412 receives the decoding success message from the variable-node calculation circuitry 416, then the decoding successes. If the processing unit 412 receives the decoding fail message from the variable-node calculation circuitry 416, then the decoding fails and the process proceeds to step S758.

Step S758: The variable j is increased by one to indicate that the bit flipping for this chunk has completed.

Step S759: It is determined whether the variable i exceeds the total number of chunks $MAX_{chk}$ that need to be processed. If so, it means that the bit flipping for this iteration has completed, exits the process and proceeds to step S625 in FIG. 6. Otherwise, the process proceeds to step S751.

Step S625: It is determined whether the variable nodes generated by the bit flipping of this iteration passes the examination. If the processing unit 412 receives the decoding success message from the variable-node calculation circuitry 416 in step S623, then the decoding successes and the whole error correction procedure ends. If the processing unit 412 does not receive the decoding success message from the variable-node calculation circuitry 416 in step S623, then the decoding fails and the process proceeds to step S627.

Step S627: The variable i is increased by one to indicate that the bit flipping of his iteration has completed.

Step S629: It is determined whether the variable i exceeds to the preset maximum allowable number of iterations during the observation period, $MAX_{obv}$, where $MAX_{obv}$ is a positive integer. If so, it means that the observation period, in which the sequential selection strategy is used, is over, and the process proceeds to step S630. Otherwise, it means that the observation period using the sequential selection strategy has not ended, and the process proceeds to step S621. In some embodiments, $MAX_{obv}$ is set to 3 or the greater.

Step S630: It is determined whether the variable i exceeds the preset maximum allowable number of times, $MAX_{itr}$. If so, it means that the decoding fails for this codeword and the whole procedure ends. Otherwise, the process proceeds to step S640.

Figure 8:
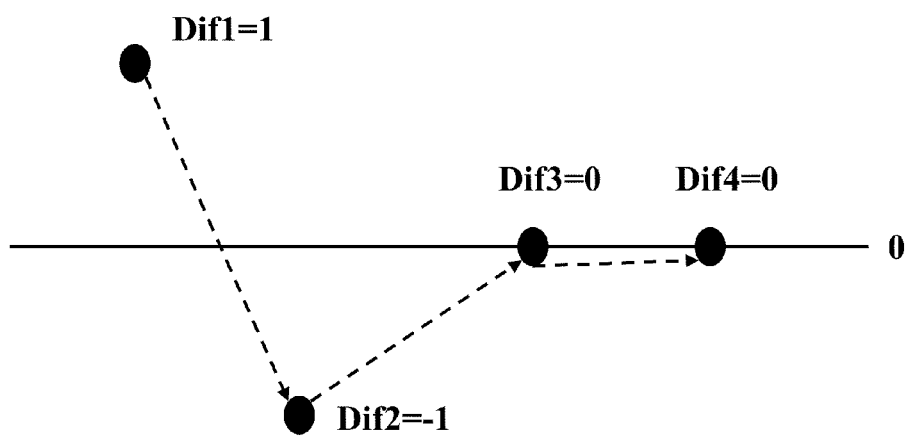
FIG. 8 is a schematic diagram showing variations of threshold differences according to an embodiment of the invention.

Step S640: It is determined whether the bit flipping algorithm has entered the trapping state according to the historical variations of the thresholds for this codeword in previous iterations. If so, then the process proceeds to step S650. Otherwise, the process proceeds to step S621. Refer to FIG. 8 showing a schematic diagram of the variations of the threshold differences corresponding to Table 1. For example, the processing unit 412 discovers that the bit flipping algorithm possibly enters the trapping state from the records in Table 1 because the same variation pattern appears in three iterations during the observation period using the sequential selection strategy.

Step S650: The scheduling strategy is modified according to the historical variations of the thresholds for this codeword in previous iterations, and the modified scheduling strategy may be referred to the non-sequential selection strategy. The non-sequential selection strategy indicates an arbitrary selection combination of the chunks in the codeword, which is different from that under the sequential selection strategy. In some embodiments, the processing unit 412 may remove the chunk from the codeword, which corresponds to the first difference greater than 0 in the previous iteration, from being processed. Following the examples as shown in Table 1, the modified scheduling strategy is {#530, #550, #570}. In alternative embodiments, the processing unit 412 may arrange the order of corresponding chunks in the codeword according to the threshold differences from low to high in the previous iteration. Following the examples as shown in Table 1, the modified scheduling strategy is {#530, #550, #570, #510}.

Some or all of the aforementioned embodiments of the method of the invention may be implemented in a computer program such as a driver for a dedicated hardware, a Firmware Translation Layer (FM) of a storage device, or others. Other types of programs may also be suitable, as previously explained. Since the implementation of the various embodiments of the present invention into a computer program can be achieved by the skilled person using his routine skills, such an implementation will not be discussed for reasons of brevity. The computer program implementing some or more embodiments of the method of the present invention may be stored on a suitable computer-readable data carrier, or may be located in a network server accessible via a network such as the Internet, or any other suitable carrier.

A computer-readable storage medium includes volatile and non-volatile, removable and non-removable media implemented in any method or technology for storage of information such as computer-readable instruction, data structures, program modules, or other data. A computer-readable storage medium includes, but is not limited to, RAM, ROM, EEPROM, flash memory or other memory, CD-ROM, digital versatile disks (DVD), Blue-ray disk or other optical storage, magnetic cassettes, magnetic tape, magnetic disk or other magnetic storage devices, or any other medium which can be used to store the desired information and may be accessed by an instruction execution system. Note that a computer-readable medium can be paper or other suitable medium upon which the program is printed, as the program can be electronically captured via, for instance, optical scanning of the paper or other suitable medium, then compiled, interpreted, or otherwise processed in a suitable manner, if necessary, and then stored in a computer memory.

Although the embodiment has been described as having specific elements in FIGS. 1, 2, and 4, it should be noted that additional elements may be included to achieve better performance without departing from the spirit of the invention. Each element of FIGS. 1, 2, and 4 is composed of various circuitries and arranged operably to perform the aforementioned operations. While the process flows described in FIGS. 6 and 7 include a number of operations that appear to occur in a specific order, it should be apparent that these processes can include more or fewer operations, which can be executed serially or in parallel (e.g., using parallel processors or a multi-threading environment).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for decoding a Low-Density Parity-Check (LDPC) code, performed by a processing unit of an LDPC decoder, the method comprising:
   determining whether a bit flipping algorithm when decoding a codeword enters a trapping state after an observation period during which a sequential selection strategy is used, wherein the codeword is divided into a plurality of chunks in fixed-length and the sequential selection strategy indicates sequentially selecting the chunks in the codeword, and a total number of bits in each chunk is a multiple of 16; and
   modifying a scheduling strategy to a non-sequential selection strategy and performing the bit flipping algorithm on the codeword under the non-sequential selection strategy when the bit flipping algorithm enters the trapping state, wherein the non-sequential selection strategy indicates an arbitrary selection combination of the chunks in the codeword for the bit flipping algorithm, which is different from that under the sequential selection strategy,
   wherein the bit flipping algorithm is performed on one selected chunk only each time under each of the sequential selection strategy and the non-sequential selection strategy for changing states of one or more hard bits or variable nodes that are determined to be faulty in the selected chunk according to syndromes, hard bits or variable nodes, and soft bits corresponding to hard bits or variable nodes.

2. The method of claim 1, wherein the observation period comprises at least three iterations, in which performs the bit flipping algorithm on the codeword under the sequential selection strategy.

3. The method of claim 1, wherein each iteration of the observation period comprises a plurality of bit flipping procedures and each bit flipping procedure comprises:
   obtaining a first threshold corresponding to a before-bit-flipping codeword, which indicates an erroneous extent of the codeword before a bit flipping;
   performing the bit flipping algorithm on the selected chunk to generate an after-bit-flipping codeword;
   calculating a second threshold corresponding to the after-bit-flipping codeword, which indicates an erroneous extent of the codeword after the bit flipping; and
   calculating a difference by subtracting the first threshold from the second threshold, which indicates an erroneous improvement of the after-bit-flipping codeword,
   wherein whether the bit flipping algorithm when decoding the codeword enters the trapping state is determined according to historical variations of thresholds for the codeword in previous iterations.

4. The method of claim 3, wherein the step for calculating the second threshold in each bit flipping procedure comprises:
   calculating a plurality of syndrome weights for each bit in the after-bit-flipping codeword using a plurality of check equations;
   summing up the syndrome weights for each bit in the after-bit-flipping codeword; and
   obtaining a maximum value from a plurality of syndrome-weight summations for all bits in the after-bit-flipping codeword as the second threshold corresponding to the after-bit-flipping codeword.

5. The method of claim 3, wherein the bit flipping algorithm when decoding the codeword is determined to enter the trapping state when a same variation pattern of threshold differences appears in the plurality of iterations during the observation period.

6. The method of claim 3, wherein the non-sequential selection strategy removes a designated chunk from the codeword, which corresponds to a first difference greater than 0 in a previous iteration, from being processed.

7. The method of claim 3, wherein the non-sequential selection strategy arranges an order of corresponding chunks in the codeword according to threshold differences from low to high in a previous iteration.

8. A non-transitory computer-readable storage medium having stored therein program code that, when loaded and executed by a processing unit in a Low-Density Parity-Check (LDPC) decoder, causes the processing unit to:
   determine whether a bit flipping algorithm when decoding a codeword enters a trapping state after an observation period during which a sequential selection strategy is used, wherein the codeword is divided into a plurality of chunks in fixed-length and the sequential selection strategy indicates sequentially selecting the chunks in the codeword, and a total number of bits in each chunk is a multiple of 16; and
   modify a scheduling strategy to a non-sequential selection strategy and perform the bit flipping algorithm on the codeword under the non-sequential selection strategy when the bit flipping algorithm enters the trapping state, wherein the non-sequential selection strategy indicates an arbitrary selection combination of the chunks in the codeword for the bit flipping algorithm which is different from that under the sequential selection strategy, wherein the bit flipping algorithm is performed on one selected chunk only each time under each of the sequential selection strategy and the non-sequential selection strategy for changing states of one or more hard bits or variable nodes that are determined to be faulty in the selected chunk according to syndromes, hard bits or variable nodes, and soft bits corresponding to hard bits or variable nodes.

9. The non-transitory computer-readable storage medium of claim 8, wherein each iteration of the observation period comprises a plurality of bit flipping procedures and each bit flipping procedure comprises:

obtaining a first threshold corresponding to a before-bit-flipping codeword, which indicates an erroneous extent of the codeword before a bit flipping;

performing the bit flipping algorithm on the selected chunk to generate an after-bit-flipping codeword;

calculating a second threshold corresponding to the after-bit-flipping codeword, which indicates an erroneous extent of the codeword after the bit flipping; and calculating a difference by subtracting the first threshold from the second threshold, which indicates an erroneous improvement of the after-bit-flipping codeword, wherein whether the bit flipping algorithm when decoding the codeword enters the trapping state is determined according to historical variations of thresholds for the codeword in previous iterations.

10. The non-transitory computer-readable storage medium of claim 9, wherein the step for calculating the second threshold in each bit flipping procedure comprises:

calculating a plurality of syndrome weights for each bit in the after-bit-flipping codeword using a plurality of check equations;

summing up the syndrome weights for each bit in the after-bit-flipping codeword; and obtaining a maximum value from a plurality of syndrome-weight summations for all bits in the after-bit-flipping codeword as the second threshold corresponding to the after-bit-flipping codeword.

11. The non-transitory computer-readable storage medium of claim 9, wherein the bit flipping algorithm when decoding the codeword is determined to enter the trapping state when a same variation pattern of threshold differences appears in the plurality of iterations during the observation period.

12. The non-transitory computer-readable storage medium of claim 9, wherein the non-sequential selection strategy removes a designated chunk from the codeword, which corresponds to a first difference greater than 0 in a previous iteration, from being processed.

13. The non-transitory computer-readable storage medium of claim 9, wherein the non-sequential selection strategy arranges an order of corresponding chunks in the codeword according to threshold differences from low to high in a previous iteration.

14. An apparatus for decoding a Low-Density Parity-Check (LDPC) code, comprising:

a variable-node calculation circuitry; and a processing unit, coupled to the variable-node calculation circuitry, arranged operably to: determine whether a bit flipping algorithm when decoding a codeword enters a trapping state after an observation period during which a sequential selection strategy is used, wherein the codeword is divided into a plurality of chunks in fixed-length and the sequential selection strategy indicates sequentially selecting the chunks in the codeword, and a total number of bits in each chunk is a multiple of 16; and modify a scheduling strategy to a non-sequential selection strategy and drive the variable-node calculation circuitry to perform the bit flipping algorithm on the codeword under the non-sequential selection strategy when the bit flipping algorithm enters the trapping state, wherein the non-sequential selection strategy indicates an arbitrary selection combination of the chunks in the codeword for the bit flipping algorithm, which is different from that under the sequential selection strategy, wherein the bit flipping algorithm is performed on one selected chunk only each time under each of the sequential selection strategy and the non-sequential selection strategy for changing states of one or more hard bits or variable nodes that are determined to be faulty in the selected chunk according to syndromes, hard bits or variable nodes, and soft bits corresponding to hard bits or variable nodes.

15. The apparatus of claim 14, wherein the observation period comprises at least three iterations, in which performs the bit flipping algorithm on the codeword under the sequential selection strategy.

16. The apparatus of claim 14, wherein each iteration of the observation period comprises a plurality of bit flipping procedures and each bit flipping procedure comprises:

obtaining a first threshold corresponding to a before-bit-flipping codeword, which indicates an erroneous extent of the codeword before a bit flipping;

performing the bit flipping algorithm on the selected chunk to generate an after-bit-flipping codeword;

calculating a second threshold corresponding to the after-bit-flipping codeword, which indicates an erroneous extent of the codeword after the bit flipping; and calculating a difference by subtracting the first threshold from the second threshold, which indicates an erroneous improvement of the after-bit-flipping codeword, wherein whether the bit flipping algorithm when decoding the codeword enters the trapping state is determined according to historical variations of thresholds for the codeword in previous iterations.

17. The apparatus of claim 16, wherein the operation for calculating the second threshold in each bit flipping procedure comprises:

calculating a plurality of syndrome weights for each bit in the after-bit-flipping codeword using a plurality of check equations;

summing up the syndrome weights for each bit in the after-bit-flipping codeword; and obtaining a maximum value from a plurality of syndrome-weight summations for all bits in the after-bit-flipping codeword as the second threshold corresponding to the after-bit-flipping codeword.

18. The apparatus of claim 16, wherein the bit flipping algorithm when decoding the codeword is determined to enter the trapping state when a same variation pattern of threshold differences appears in the plurality of iterations during the observation period.

19. The apparatus of claim 16, wherein the non-sequential selection strategy removes a designated chunk from the codeword, which corresponds to a first difference greater than 0 in a previous iteration, from being processed.

20. The apparatus of claim 16, wherein the non-sequential selection strategy arranges an order of corresponding chunks in the codeword according to threshold differences from low to high in a previous iteration.

* * * * *